United States Patent
Xu et al.

(10) Patent No.: US 8,487,674 B1
(45) Date of Patent: Jul. 16, 2013

(54) RESET CIRCUIT

(75) Inventors: Zhen-Ji Xu, Shenzhen (CN); Yong-Song Shi, Shenzhen (CN); Huan Xia, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/434,795

(22) Filed: Mar. 29, 2012

(30) Foreign Application Priority Data

Mar. 8, 2012 (CN) .......................... 2012 1 0059594

(51) Int. Cl.
*H03L 7/00* (2006.01)
(52) U.S. Cl.
USPC .............................. 327/143; 327/142; 327/198
(58) Field of Classification Search
USPC ......................................... 327/142, 143, 198
See application file for complete search history.

(56) References Cited

U.S. PATENT DOCUMENTS

| | | | | |
|---|---|---|---|---|
| 4,634,904 | A | * | 1/1987 | Wong ............................. 327/143 |
| 5,144,159 | A | * | 9/1992 | Frisch et al. ................... 327/198 |
| 6,215,342 | B1 | | 4/2001 | Morrill |
| 6,633,187 | B1 | * | 10/2003 | May et al. ...................... 327/198 |
| 2010/0156479 | A1 | * | 6/2010 | Matsubara et al. ........... 327/143 |
| 2010/0180059 | A1 | | 7/2010 | Sugiura et al. |
| 2011/0221483 | A1 | * | 9/2011 | Liu et al. ....................... 327/142 |

* cited by examiner

*Primary Examiner* — Lincoln Donovan
*Assistant Examiner* — Brandon S Cole
(74) *Attorney, Agent, or Firm* — Altis Law Group, Inc.

(57) ABSTRACT

An exemplary reset circuit includes a first connection jack connected to a first power supply, a second connection jack connected to a second power supply, a reset IC, a voltage response module, and a control module. The voltage response module outputs a first response signal when the voltage provided by the second power supply is abnormal, and then the control module outputs a first voltage which is less than the voltage provided by the first power supply. The voltage response module outputs a second response signal when the voltage provided by the second power supply is normal, and then the control module outputs a second voltage which is equal to the voltage provided by the first power supply. When the voltage received by the reset IC is changed from the first voltage to the second voltage, the reset IC outputs a reset signal to reset the processing IC.

9 Claims, 2 Drawing Sheets

RESET CIRCUIT

BACKGROUND

1. Technical Field

The present disclosure relates to electrical circuits and, more particularly, to a reset circuit.

2. Description of Related Art

A conventional reset circuit of an electronic device only detects the voltage supplied to a processing integrated circuit (IC). When the voltage provided to the processing IC is abnormal, the reset circuit generates a signal to reset the processing IC. However, when the voltage supplied to the other components is abnormal, such as the voltage supplied to the LCD, a reset circuit of related art will not reset the processing IC. The processing IC may work, but some functions may work abnormally.

It is desirable to provide a new reset circuit to resolve the above problems.

BRIEF DESCRIPTION OF THE DRAWINGS

The components in the drawings are not necessarily drawn to scale, the emphasis instead being placed upon clearly illustrating the principles of the reset circuit. Moreover, in the drawings, like reference numerals designate corresponding parts throughout the several views.

DETAILED DESCRIPTION

The disclosure is illustrated by way of example and not by way of limitation in the figures of the accompanying drawings. It should be noted that references to "an" or "one" embodiment in this disclosure are not necessarily to the same embodiment, and such references mean at least one.

Figure 1:
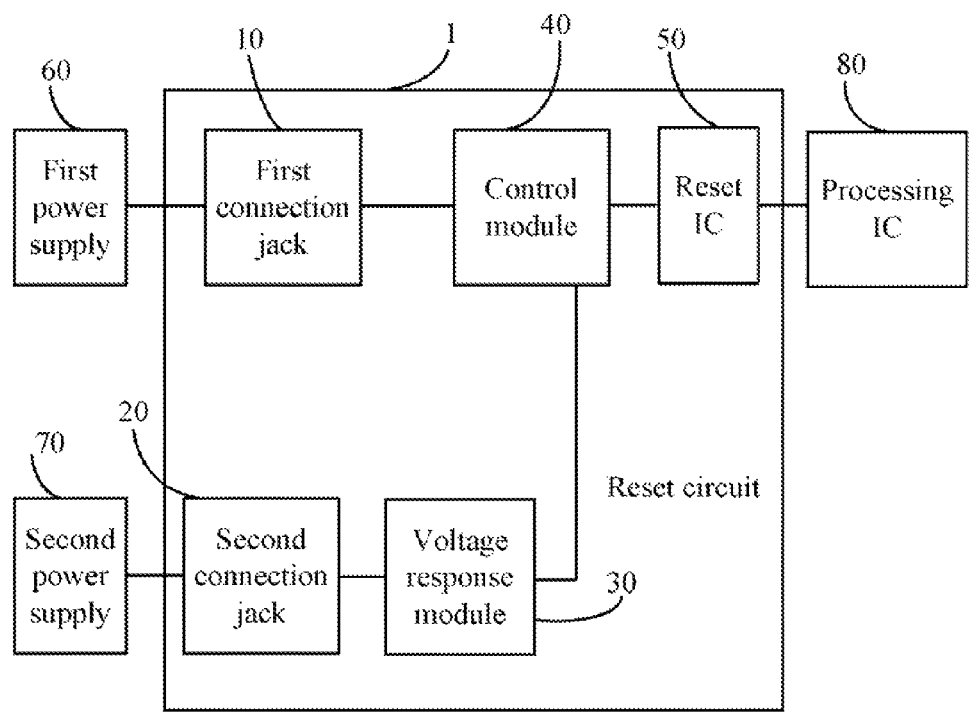
FIG. 1 is a block diagram of a reset circuit in accordance with an exemplary embodiment.

Referring to FIG. 1, a block diagram of a reset circuit 1 is shown. The reset circuit 1 includes a first connection jack 10, a second connection jack 20, a voltage response module 30, a control module 40, and a reset IC 50. The first connection jack 10 is connected to a first power supply 60 to receive power from the first power supply 60. The second connection jack 20 is connected to a second power supply 70 to receive power from the second power supply 70. The first power supply 60 provides voltage to a processing IC 80. The voltage provided by the first power supply is represented by the first power supply voltage. In the embodiment, the normal first power supply voltage is 3.3V. The second power supply 70 provides voltage different from the voltage provided by the first power supply. The voltage provided by the second power supply is represented by the second power supply voltage. In the embodiment, the normal second power supply voltage is 5V.

The voltage response module 30 outputs a first response signal when the second power supply voltage is abnormal, such as the second power supply voltage changing from a voltage less than 5V to a voltage equal to 5V, for example, and outputs a second response signal when the second power supply voltage is normal. The control module 40 outputs a first voltage which is less than the first power supply voltage according to the first response signal, and outputs a second voltage which is equal to the first power supply voltage when the second response signal is received. The reset IC 50 is connected between the control module 40 and the processing IC 80, and detects the voltage output by the control module 40. When the reset IC 50 detects that the voltage output by the control module 40 is changed from the first voltage to the second voltage, the reset IC 50 generates a reset signal to reset the processing IC 80.

Figure 2:
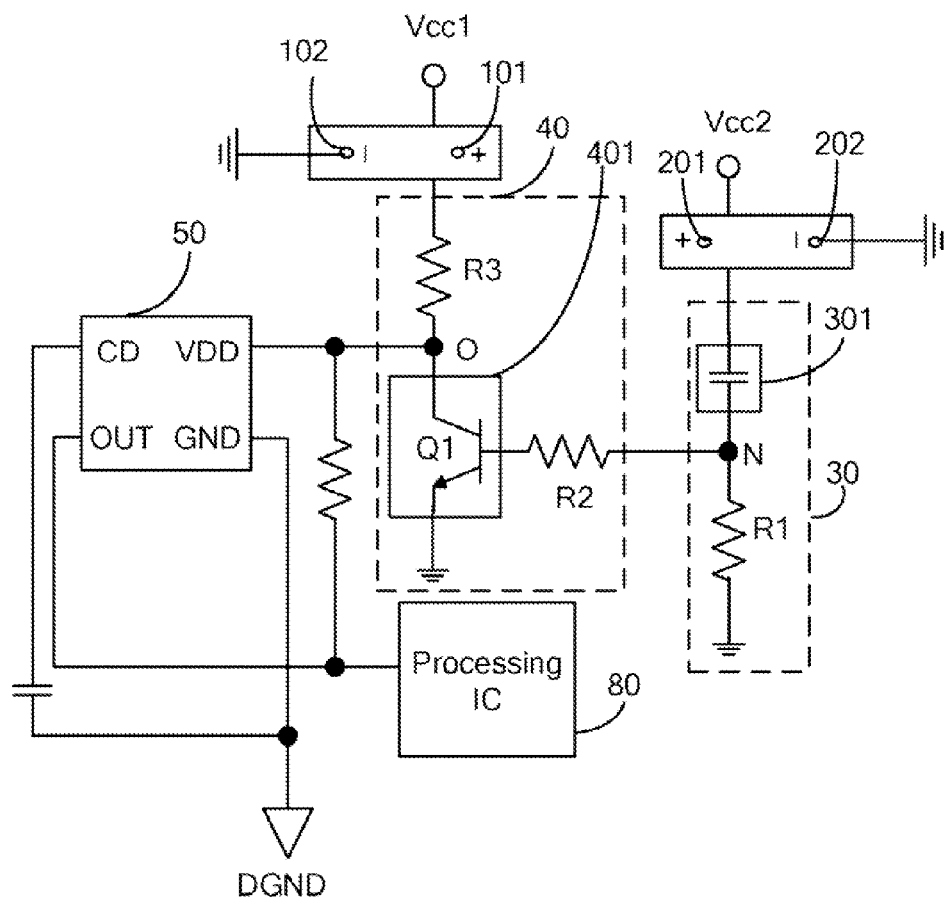
FIG. 2 is a circuit diagram of the reset circuit of FIG. 1.

Referring to FIG. 2, a circuit diagram of the reset circuit 1 is shown. The first connection jack 10 includes a first anode input port 101 and a first cathode input port 102 respectively connected to an anode and a cathode of the first power supply 60. The second connection jack 20 includes a second anode input port 201 and a second cathode input port 202 respectively connected to an anode and a cathode of the second power supply 70. In FIG. 2, the first power supply 60 is represented by Vcc1, and the second power supply 70 is represented by Vcc2.

The voltage response module 30 includes a capacitor 301 and a resistor R1. The capacitor 301 and the resistor R1 are connected in parallel between the second anode input port 201 and ground. A node N formed between the capacitor 301 and the resistor R1 is connected to the control module 40.

The control module 40 includes a first resistor R2, a high voltage activated switch 401, and a second resistor R3. In the embodiment, an npn bipolar junction transistor (BJT) Q1 is taken as an example to illustrate the high voltage activated switch 401. The npn BJT Q1 includes a base, an emitter, and a collector. The base of the npn BJT Q1 is connected to the node N formed between the capacitor 301 and the resistor R1. In the embodiment, the base of the npn BJT Q1 is connected to the node N through the first resistor R2. The emitter of the npn BJT Q1 is grounded. The collector of the npn BJT Q1 is connected to the first anode input port 101. In the embodiment, the collector of the npn BJT Q1 is connected to the first anode input port 101 through the second resistor R3. A node O formed between the collector of the npn BJT Q1 and the second resistor R3 is connected to the reset IC 50.

The reset IC 50 includes a first terminal VDD and a second terminal OUT. The first terminal VDD is connected to the node O. The second terminal OUT is connected to the processing IC 80.

When the second power supply voltage is abnormal, for example when the second power supply voltage changing from a voltage less than 5V to a voltage equal to 5V, the second power supply 70 outputs an alternating voltage to charge the capacitor 301. The second power supply 70 further produces a voltage $V_O$ at the node N when the capacitor 301 is fully charged. Thus the voltage response module 30 outputs the first response signal which includes a high level signal to the base of the npn BJT Q1, causing the base voltage of the npn BJT Q1 to be higher than the emitter voltage of the npn BJT Q1, and thus the npn BJT Q1 is turned on. The first power supply 60 is grounded through the second resistor R3 and the turned-on npn BJT Q1, thus the control module 40 outputs the first voltage less than the first power supply voltage to the reset IC 50.

When the second power supply voltage is normal, the capacitor 301 discharges through the resistor R1, the voltage at the node N is low. Thus the voltage response module 30 outputs the second response signal which includes a low level signal to the base of the npn BJT Q1, causing the base voltage of the npn BJT Q1 to be equal to or less than the emitter voltage of the npn BJT Q1, and thus the npn BJT Q1 is turned off. Thus the control module 40 outputs the second voltage equal to the first power supply voltage to the reset IC 50.

When the voltage received by the first terminal VDD of the reset IC 50 is changed from the first voltage to the second voltage, the second terminal OUT of the reset IC 50 outputs a reset signal to the processing IC 80. The processing IC 80 is thus reset according to the reset signal output by the reset IC 50.

Although the current disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A reset circuit comprising:
a first connection jack to connect to a first power supply to receive power from a first power supply, wherein the first power supply provides voltage to a processing integrated circuit (IC);
a second connection jack to connect to a second power supply to receive power from a second power supply, wherein the second power supply provides voltage different from the voltage provided by the first power supply;
a reset IC electrically connected to the first connection jack and to reset the processing IC;
a voltage response module electrically connected to the second connection jack, to output a first response signal when voltage provided by the second power supply is abnormal, and output a second response signal when the voltage provided by the second power supply is normal; and
a control module electrically connected to the voltage response module and the reset IC, to output a first voltage which is less than the voltage provided by the first power supply when the voltage response module outputs a first response signal, and output a second voltage which is equal to the voltage provided by the first power supply when the voltage response module outputs a second response signal;
wherein when the voltage received by the reset IC is changed from the first voltage to the second voltage, the reset IC outputs a reset signal to reset the processing IC.

2. The reset circuit as described in claim 1, wherein the control module comprises a first resistor, a high voltage activated switch, and a second resistor, the high voltage activated switch is connected to the voltage response module through the first resistor, and connected to an anode of the first power supply through the second resistor and the first connection jack.

3. The reset circuit as described in claim 2, wherein the high voltage activated switch is an npn bipolar junction transistor (BJT).

4. The reset circuit as described in claim 3, wherein the npn BJT comprises a base, an emitter, and a collector, the base of the npn BJT is connected to the voltage response module through the first resistor, the emitter of the npn BJT is ground, and the collector of the npn BJT is connected to the anode of the first power supply through the second resistor and the first connection jack.

5. The reset circuit as described in claim 4, wherein the base voltage of the npn BJT is higher than the emitter voltage of the npn BJT when the voltage response module outputs a first response signal which comprises a high level signal to the control module, causing the npn BJT to be turned on, the first power supply is grounded through the second resistor and the turned on npn BJT, thus the voltage response module outputs a first voltage which is less than the voltage provided by the first power supply to the reset IC.

6. The reset circuit as described in claim 4, wherein the base voltage of the npn BJT is less than or equal to the emitter voltage of the npn BJT when the voltage response module outputs a second response signal which comprises a low level signal to the control module, causing the npn BJT to be turned off, the voltage response module outputs a second voltage which is equal to the voltage provided by the first power supply to the reset IC.

7. The reset circuit as described in claim 4, wherein the voltage response module comprises a capacitor and a resistor, the capacitor and the resistor are connected in parallel between the second power supply and ground, the node formed between the capacitor and the resistor is connected to the base of the npn BJT of the control module through the first resistor of the control module.

8. The reset circuit as described in claim 7, wherein the second power supply outputs an alternating voltage to charge the capacitor when the voltage provided by the second power supply is abnormal, and produces a voltage at the node formed between the capacitor and the resistor, thus the voltage response module outputs a first response signal which comprises a high level signal to the control module.

9. The reset circuit as described in claim 7, wherein the second power supply stops charging the capacitor when the voltage provided by the second power supply is normal, the capacitor discharges through the resistor, causing the voltage of the node formed between the capacitor and the resistor is low, thus the voltage response module outputs a second response signal which comprises a low level signal to the control module.

* * * * *